US012740419B2

(12) United States Patent
Lin et al.

(10) Patent No.: US 12,740,419 B2
(45) Date of Patent: Sep. 15, 2026

(54) ANTI-WARPAGE REINFORCED CARRIER

(71) Applicant: KINSUS INTERCONNECT TECHNOLOGY CORP., Taoyuan City (TW)

(72) Inventors: Ting-Hao Lin, Taoyuan City (TW); Chiao-Cheng Chang, Taoyuan City (TW); Chien-Wei Chang, Taoyuan City (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 378 days.

(21) Appl. No.: 18/390,626

(22) Filed: Dec. 20, 2023

(65) Prior Publication Data

US 2025/0079333 A1 Mar. 6, 2025

(30) Foreign Application Priority Data

Aug. 28, 2023 (TW) ................................ 112132397

(51) Int. Cl.

| | |
|---|---|
| ***H10W 42/00*** | (2026.01) |
| ***H10W 70/685*** | (2026.01) |
| ***H10W 90/00*** | (2026.01) |
| *H10W 72/90* | (2026.01) |
| *H10W 80/00* | (2026.01) |

(52) U.S. Cl.

CPC ....... *H10W 42/121* (2026.01); *H10W 70/685* (2026.01); *H10W 90/701* (2026.01); *H10W 72/9415* (2026.01); *H10W 80/743* (2026.01); *H10W 90/724* (2026.01); *H10W 90/794* (2026.01)

(58) Field of Classification Search

CPC .......................... H10W 42/121; H10W 90/701

USPC ........................................................ 257/690

See application file for complete search history.

(56) References Cited

U.S. PATENT DOCUMENTS

2009/0072403 A1* 3/2009 Ito ...................... H10W 20/095 438/653
2020/0343169 A1* 10/2020 Tanaka ................ H05K 3/4661

* cited by examiner

*Primary Examiner* — Ajay Arora

(74) *Attorney, Agent, or Firm* — Juan Carlos A. Marquez; Marquez IP Law Office, PLLC

(57) ABSTRACT

An anti-warpage reinforced carrier includes a substrate, a plurality of rigid insulating plates, a plurality of metal posts, a resin layer, a first circuit layer, and a second circuit layer. The rigid insulating plates are arranged on the positioning areas on the substrate. The metal posts are in the second through holes penetrating through the rigid insulating plate. The resin layer covers the rigid insulating plates and the upper surface of the substrate, and includes a plurality of openings. The first circuit layer is on the resin layer and in the openings, and is connected to the metal posts. The second circuit layer is on a lower surface of the substrate and in the first through holes penetrating through the substrate, and is connected to the metal posts. By embedding rigid insulating plates therein, the anti-warpage reinforced carrier provides thermal stability, and is suitable for applications in advanced chip packaging.

12 Claims, 6 Drawing Sheets

ANTI-WARPAGE REINFORCED CARRIER

CROSS-REFERENCES TO RELATED APPLICATIONS

This non-provisional application claims priority under 35 U.S.C. § 119 (a) to Patent Application No. 112132397 filed in Taiwan, R.O.C. on Aug. 28, 2023 and patent application Ser. No. 11/214,0930 filed in Taiwan, R.O.C. on Oct. 25, 2023, the entire contents of which are hereby incorporated by reference.

BACKGROUND

Technical Field

The present invention relates to the field of chip packaging, and in particular, to an anti-warpage reinforced carrier.

Related Art

After packaging requirements of semiconductor chips from 2.0D to 3.0D have appeared, density or complexity is increased greatly. In order to meet the packaging requirements of the semiconductor chips, interposers are usually introduced for packaging in a small-chip and large-splicing manner.

However, due to the requirements of crisscross large-area splicing, the biggest challenge to advanced packaging is the flatness and stability of a material substrate, especially in the face of large temperature changes in the welding process. Currently, by increasing the thickness of a core plate, the industry can improve an assembly process, actual operation of products, and the coplanarity and stability of packaging planes. However, the current core plate is made of glass fiber, which has the biggest disadvantage of thermal stability. In the face of small chips and large-area packaging, high coplanarity and stability are necessary characteristics. Therefore, improving the temperature resistance and mechanical strength of carriers is a major challenge today.

SUMMARY

In order to solve the problems faced by the related art, an anti-warpage reinforced carrier is provided. The anti-warpage reinforced carrier includes a substrate, a plurality of rigid insulating plates, a plurality of metal posts, a resin layer, a first circuit layer, and a second circuit layer.

The substrate has an upper surface and a lower surface. A plurality of positioning areas are defined on the upper surface. The substrate further has a plurality of first through holes penetrating through the upper surface and the lower surface. The rigid insulating plates are arranged on the positioning areas respectively. Each rigid insulating plate has a plurality of second through holes penetrating through a first surface and a second surface of each rigid insulating plate. The metal posts are filled in the second through holes respectively. The resin layer is on the upper surface of the substrate and the rigid insulating plates and covers the rigid insulating plates and the upper surface of the substrate. The resin layer includes a plurality of openings. The first circuit layer is on a portion of a surface of the resin layer and in the openings, and is connected to the metal posts. The second circuit layer is on a portion of the lower surface of the substrate and in the first through holes, and is connected to the metal posts.

In some embodiments, the openings are in positional correspondence with the second through holes respectively.

In some embodiments, the first surface of each rigid insulating plate further includes a third circuit layer. The third circuit layer is connected to the metal post in the second through holes and the first circuit layer. Furthermore, in some embodiments, the second surface of each rigid insulating plate further includes a fourth circuit layer. The fourth circuit layer is connected to the metal post in the second through holes and the second circuit layer.

In some embodiments, a coating is further provided between a side wall surface of the second through holes and the metal post. Preferably, in some embodiments, the coating is a resin coating.

In some embodiments, the upper surface of the substrate has a plurality of grooves. The grooves define the positioning areas, and the rigid insulating plates are clamped into the grooves respectively.

In some embodiments, the anti-warpage reinforced carrier further includes a first anti-welding paint layer, a first pad layer, a second anti-welding paint layer, and a second pad layer. The first anti-welding paint layer is on the resin layer and has a plurality of first pad openings. The first pad layer is filled in the first pad openings and is electrically connected to the first circuit layer. The second anti-welding paint layer is on the lower surface of the substrate and has a plurality of second pad openings. The second pad layer is filled in the second pad openings and is electrically connected to the second circuit layer.

Furthermore, in some embodiments, the first pad layer includes a plurality of first pads protruding from the first anti-welding paint layer. The second pad layer includes a plurality of second pads protruding from the second anti-welding paint layer. A first gap between the first pads is smaller than a second gap between the second pads.

Furthermore, in some embodiments, the anti-warpage reinforced carrier further includes a first protective layer, a first redistribution layer, a second protective layer, and a second redistribution layer. The first protective layer is between the resin layer and the first anti-welding paint layer, covers the first circuit layer, and has a plurality of first openings. The first redistribution layer is on a portion of the first protective layer, is filled in the first openings, and is connected to the first circuit layer and the first pad layer. The second protective layer is between the lower surface of the substrate and the second anti-welding paint layer, covers the second circuit layer, and has a plurality of second openings. The second redistribution layer is on a portion of the second protective layer, is filled in the second openings, and is connected to the second circuit layer and the second pad layer.

In detail, in some embodiments, the first openings are in positional correspondence with the first pad openings respectively, and the second openings are in positional correspondence with the second pad openings respectively.

In some embodiments, each rigid insulating plate is a ceramic plate, a glass plate, or a silicon carbide plate.

In some embodiments, each rigid insulating plate has a length and width of 3 cm to 100 cm and a thickness of 0.1 mm to 1 mm.

As shown in the previous embodiments, by the embedded rigid insulating plates, the anti-warpage reinforced carrier can effectively provide thermal stability while heated, increase mechanical strength, and provide high coplanarity and stability of small chips and large-area packaging, and is suitable for high-density applications in advanced chip packaging.

DETAILED DESCRIPTION

It should be understood that when an element is referred to as "arranged" or "connected" to another element, it may mean that the element is directly located on another element, or there may be an intermediate element through which the element is connected to another element. Conversely, when an element is referred to as "directly arranged/connected onto another element" or "directly arranged/connected to another element", it will be understood that there is an explicit definition of no intermediate element.

In addition, the terms "first", "second", and "third" are used only for distinguishing one element, component, area, layer, or portion from another element, component, area, layer, or portion, and do not represent their necessary sequence. Further, relative terms such as "down" and "up" may be used herein for describing the relationship of one element to another element. It should be understood that the relative terms are intended to encompass different orientations of a device other than those shown in the figures. For example, if the device in one of the drawings is flipped, an element described as being on the "lower" side of another element will be oriented on the "upper" side of another element. This only indicates the relative azimuth relationship, not the absolute azimuth relationship.

Figure 1:
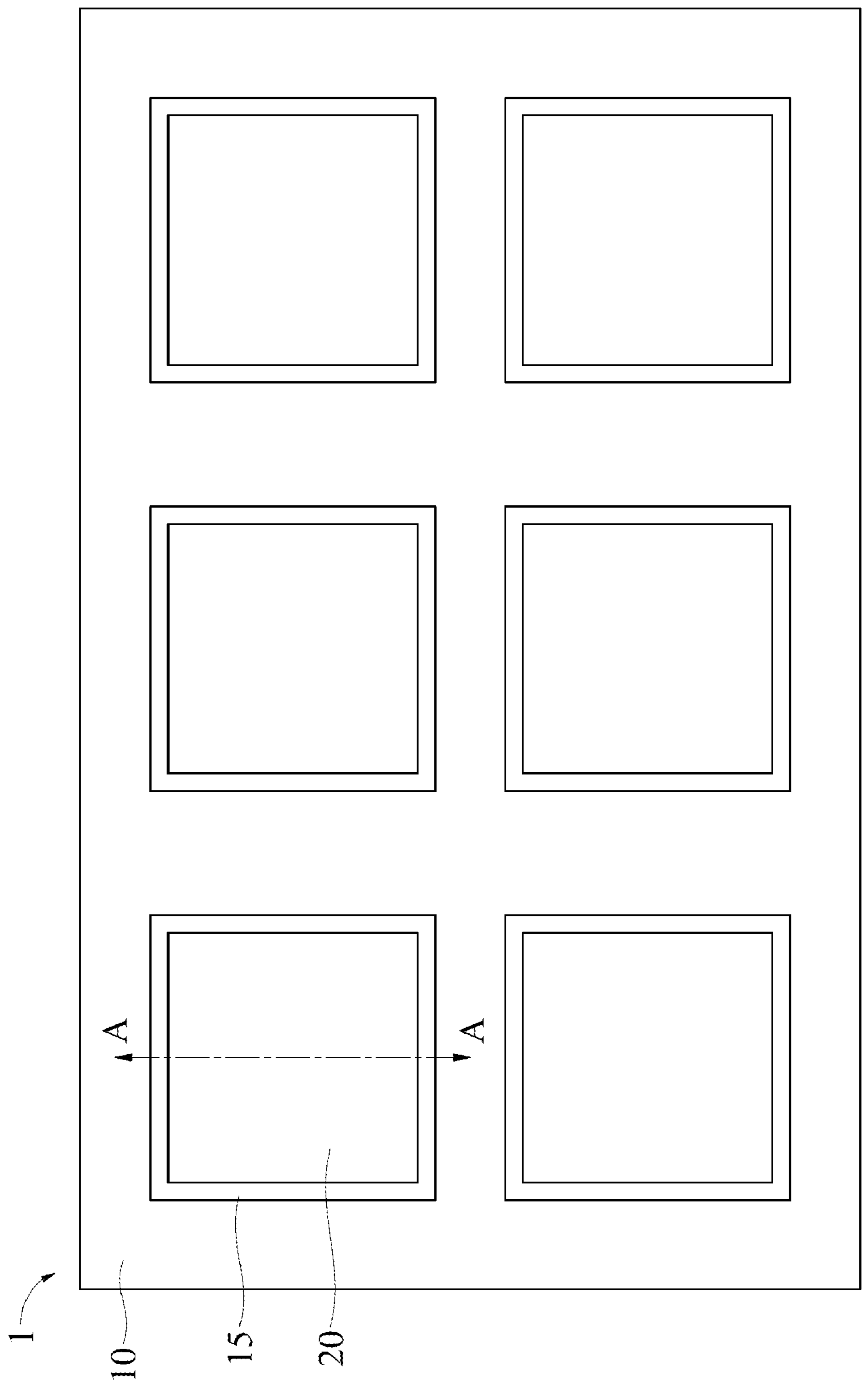
FIG. 1 is a top view of an anti-warpage reinforced carrier according to a first embodiment.
Figure 2:
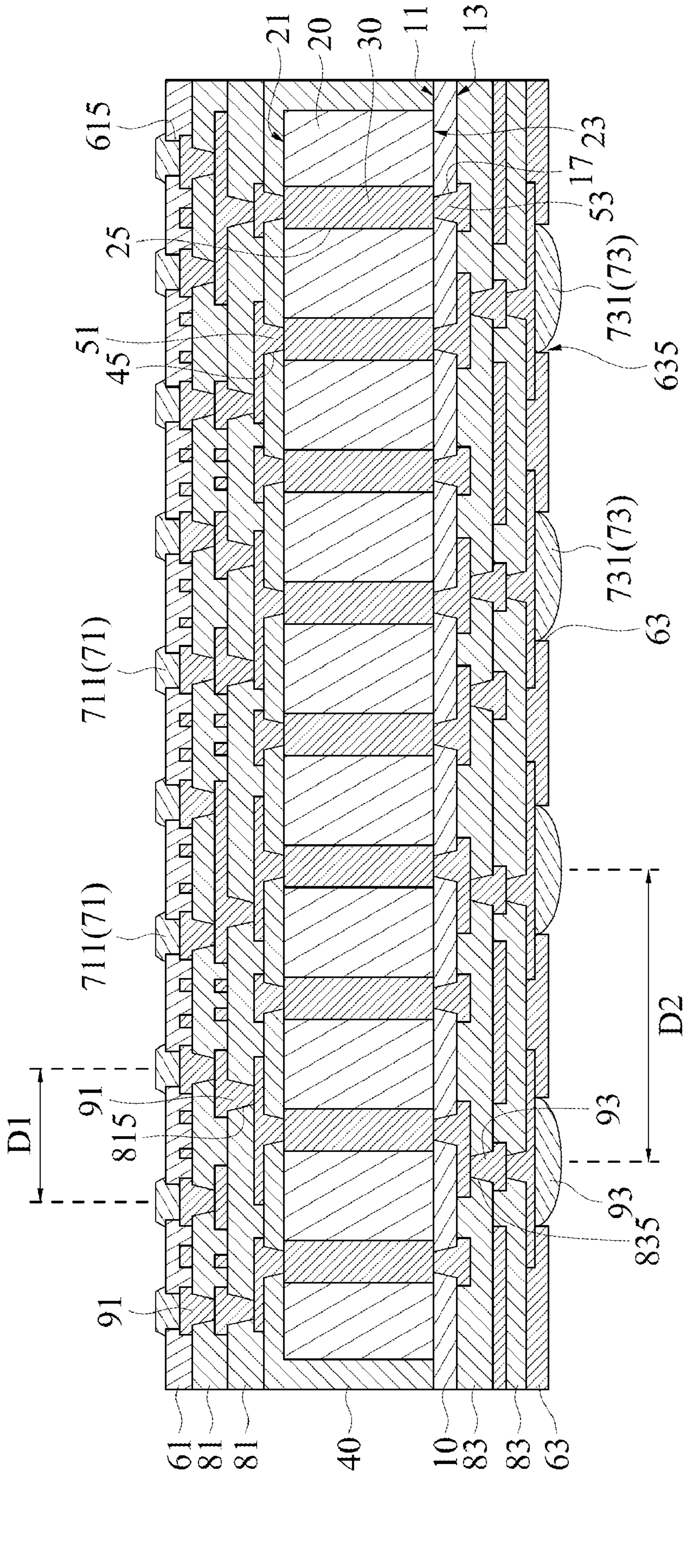
FIG. 2 is a partial cross-sectional view of an anti-warpage reinforced carrier according to a first embodiment.

FIG. 1 is a top view of an anti-warpage reinforced carrier according to a first embodiment. FIG. 2 is a partial cross-sectional view of an anti-warpage reinforced carrier according to a first embodiment. As shown in FIG. 1 and FIG. 2, an anti-warpage reinforced carrier 1 includes a substrate 10, a plurality of rigid insulating plates 20, a plurality of metal posts 30, a resin layer 40, a first circuit layer 51, and a second circuit layer 53. FIG. 1 only shows clearly relative positions of the substrate 10 and the rigid insulating plates 20 and therefore omits other elements.

As shown in FIG. 1 and FIG. 2, the substrate 10 has an upper surface 11 and a lower surface 13. A plurality of positioning areas 15 are defined on the upper surface. The substrate 10 also has a plurality of first through holes 17 penetrating through the upper surface 11 and the lower surface 13. The rigid insulating plates 20 are arranged on the positioning areas 15 respectively. Each rigid insulating plate 20 has a plurality of second through holes 25 penetrating through a first surface 21 and a second surface 23 of the rigid insulating plate 20. The metal posts 30 are filled in the second through holes 25 respectively. Here, the rigid insulating plates 20 may be ceramic plates, glass plates, or silicon carbide plates. In addition, the rigid insulating plates 20 have a length and width of 3 cm to 100 cm and a thickness of 0.1 mm to 1 mm. However, this is by way of example only and is not intended to be limiting, and the actual size of the rigid insulating plates 20 will depend on the actual product requirements.

The resin layer 40 is on the upper surface 11 of the substrate 10 and the rigid insulating plates 20 and covers the rigid insulating plates 20 and the upper surface 11 of the substrate 10. The resin layer 40 includes a plurality of openings 45. The first circuit layer 51 is on a portion of a surface of the resin layer 40 and in the openings 45, and is connected to the metal posts 30. The second circuit layer 53 is on a portion of the lower surface 13 of the substrate 10 and in the first through holes 17, and is connected to the metal posts 30.

Here, the metal posts 30 may be fabricated by a technology of thick films filled with conductive paste or by electroplating, and the main material is copper or aluminum. In other words, in the order of fabrication, the rigid insulating plates 20 may be laser-drilled and then filled with conductive paste to form the metal posts 30. The resin layer 40 is then formed thereon. Alternatively, after forming the resin layer 40, laser drilling is performed and a metal layer is filled by electroplating to form the metal posts 30 and the first circuit layer 51. If the latter is adopted, the openings 45 and the second through holes 25 are formed simultaneously, and the openings 45 are in positional correspondence with the second through holes 25 respectively.

The single and large-area rigid insulating plates 20 may suffer from large stress in the subsequent manufacturing process and may be locally cracked. Through the plurality of rigid insulating plates 20, the risk of cracking can be reduced. Furthermore, by coating the resin layer 40, it is possible to ensure that the edges of the rigid insulating plates 20 are not exposed and the interface is prevented from cracking.

Figure 3:
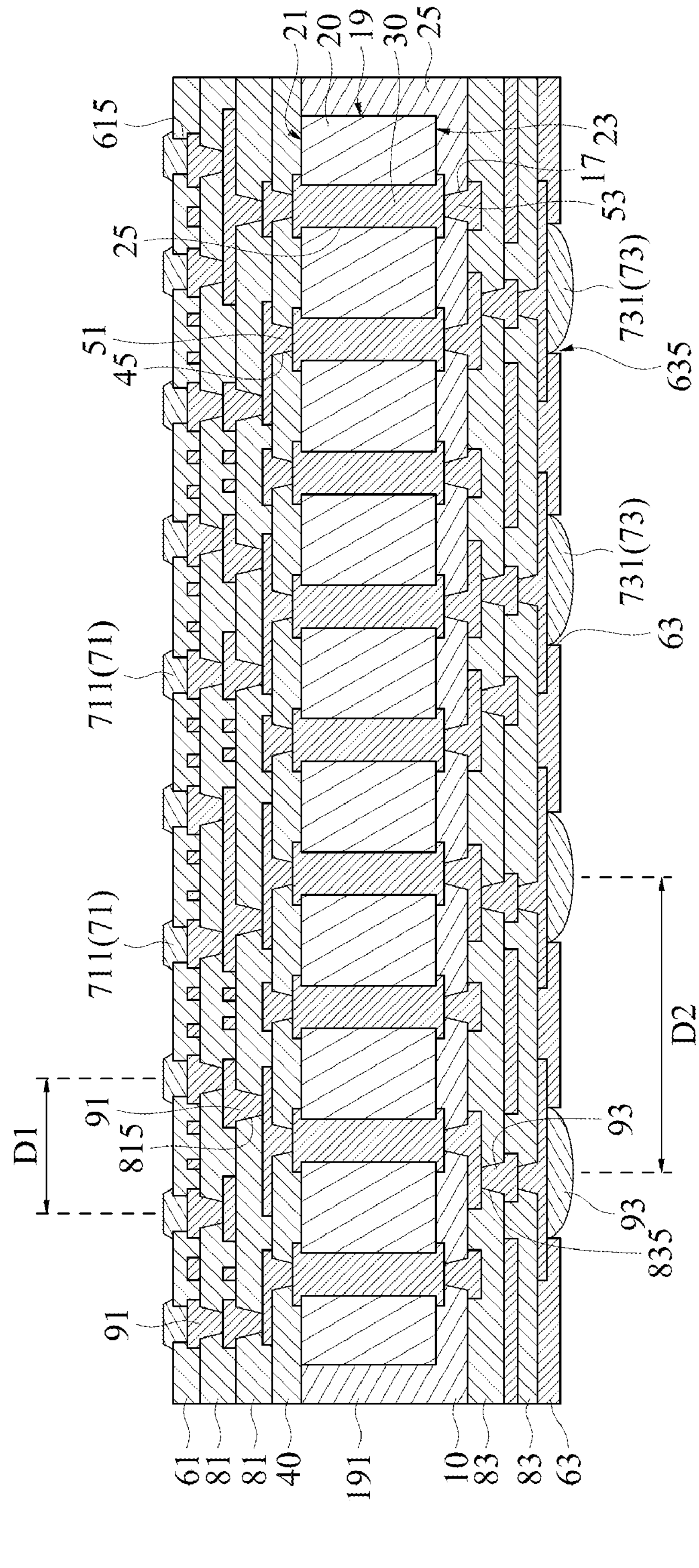
FIG. 3 is a partial cross-sectional view of an anti-warpage reinforced carrier according to a second embodiment.

FIG. 3 is a partial cross-sectional view of an anti-warpage reinforced carrier according to a second embodiment. Referring also to FIG. 2, as shown in FIG. 3, the part different from the first embodiment is that the upper surface 11 of the substrate 10 has a plurality of grooves 19. The grooves 19 define the positioning areas 15, and the rigid insulating plates 20 are clamped into the grooves 19 respectively. In other words, side edges of the rigid insulating plates 20 are in contact with wall surfaces 191 of the grooves 19. It will be understood that forming is implemented in the first embodiment by placing the rigid insulating plates 20 on the upper surface 11 of the substrate 10 and then casting the resin layer 40. In the second embodiment, the rigid insulating plates 20 are clamped into the grooves 19, and the resin layer 40 is then formed thereon.

Figure 4:
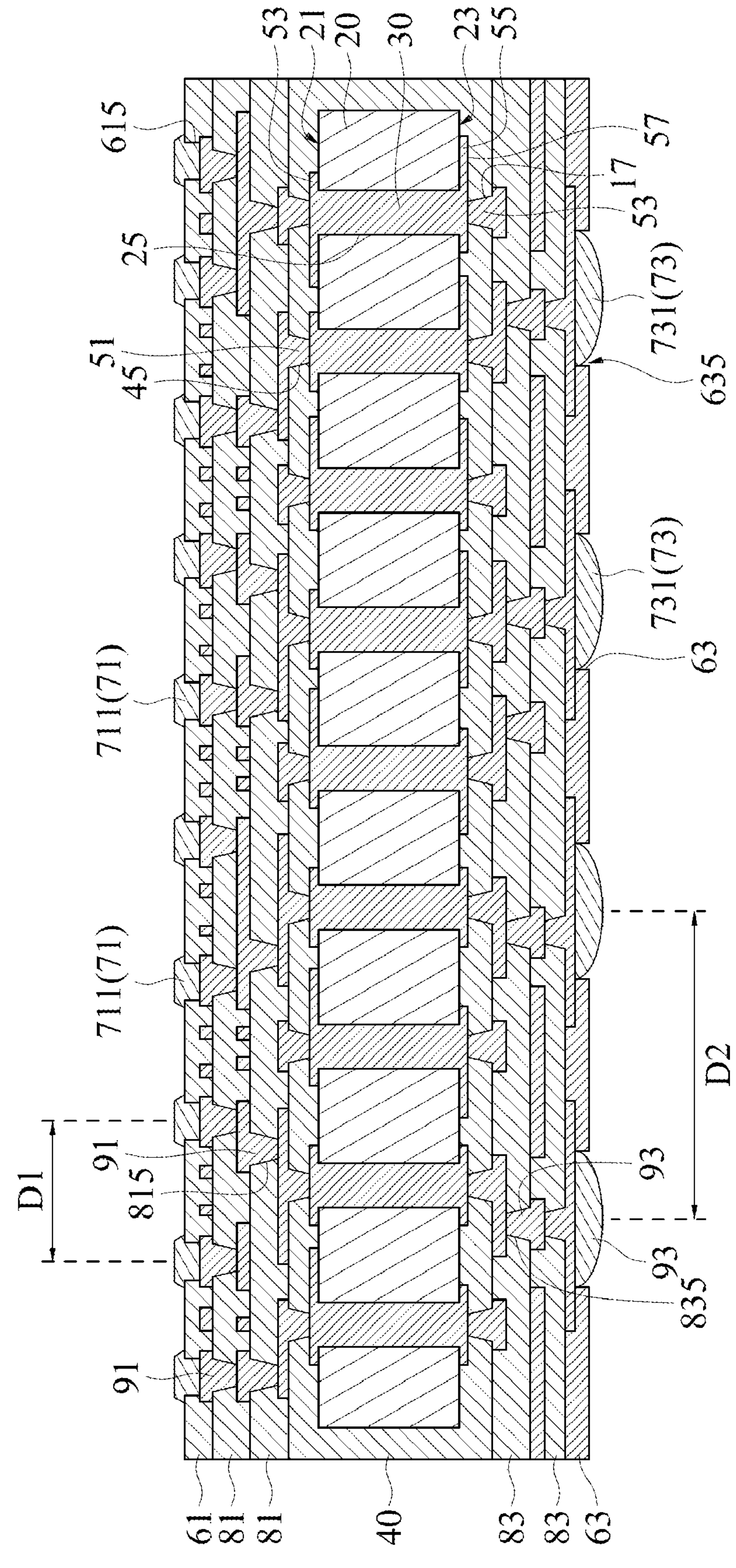
FIG. 4 is a partial cross-sectional view of an anti-warpage reinforced carrier according to a third embodiment.

FIG. 4 is a partial cross-sectional view of an anti-warpage reinforced carrier according to a third embodiment. As shown in FIG. 4, and referring to FIG. 2 and FIG. 3, the third embodiment is different from the first embodiment and the second embodiment in that the first surface 21 of the rigid insulating plate 20 further includes a third circuit layer 55. The third circuit layer 55 is connected to the metal post 30 in the second through holes 25 and the first circuit layer 51. Here, it will be understood that after laser-drilling, the rigid insulating plate 20 may form a metal film on the first surface 21 by the technology of thick films, and the metal film is filled in the second through hole 25 to form the metal post 30. Next, the third circuit layer 55 may be formed thereon by laser ablation. Furthermore, in some embodiments, the second surface 23 of each rigid insulating plate 20 further includes a fourth circuit layer 57. The fourth circuit layer 57 is connected to the metal post 30 in the second through holes 25 and the second circuit layer 53.

Referring again to FIG. 2 to FIG. 4, the substrate 10, the plurality of rigid insulating plates 20, the plurality of metal posts 30, the resin layer 40, the first circuit layer 51, and the second circuit layer 53 may be considered as a core plate. Furthermore, a layer may be added thereon. For example, the anti-warpage reinforced carrier 1 further includes a first anti-welding paint layer 61, a first pad layer 71, a second anti-welding paint layer 63, and a second pad layer 73. The first anti-welding paint layer 61 is on the resin layer 40 and has a plurality of first pad openings 615. The first pad layer 71 is filled in the first pad openings 615 and is electrically connected to the first circuit layer 51. The second anti-welding paint layer 63 is on the lower surface 13 of the substrate 10 and has a plurality of second pad openings 635. The second pad layer 73 is filled in the second pad openings 635 and is electrically connected to the second circuit layer 53.

In more detail, the first pad layer 71 includes a plurality of first pads 711. The first pads 711 protrude from the first anti-welding paint layer 61. The second pad layer 73 includes a plurality of second pads 731. The second pads 731 protrude from the second anti-welding paint layer 63. A first gap D1 between the first pads 711 is smaller than a second gap D2 between the second pads 731. In other words, the anti-warpage reinforced carrier 1 may be used as an interposer between a chip and a system master, and the function of gap distribution can be achieved through the first circuit layer 51 and the second circuit layer 53.

Furthermore, in some embodiments, the anti-warpage reinforced carrier 1 further includes a first protective layer 81, a first redistribution layer 91, a second protective layer 83, and a second redistribution layer 93. The first protective layer 81 is between the resin layer 40 and the first anti-welding paint layer 61, covers the first circuit layer 51, and has a plurality of first openings 815. The first redistribution layer 91 is on a portion of the first protective layer 81, is filled in the first openings 815, and is connected to the first circuit layer 51 and the first pad layer 71. The second protective layer 83 is between the lower surface 13 of the substrate 10 and the second anti-welding paint layer 63, covers the second circuit layer 53, and has a plurality of second openings 835. The second redistribution layer 93 is on a portion of the second protective layer 83, is filled in the second openings 835, and is connected to the second circuit layer 53 and the second pad layer 73.

In fact, the first redistribution layer 91 and the second redistribution layer 93 are mainly designed to match the chip and system pins so as to lead the line out to different positions and match different positions and gaps of the first pads 711 and the second pads 731. In practice, a plurality of first protective layers 81 and first redistribution layers 91 and a plurality of second protective layers 83 and second redistribution layers 93 may be arranged.

In some embodiments, the first openings 815 are in positional correspondence with the first pad openings 615 respectively, and the second openings 835 are in positional correspondence with the second pad openings 635 respectively. However, this is by way of example only and is not intended to be limiting.

Figure 6:
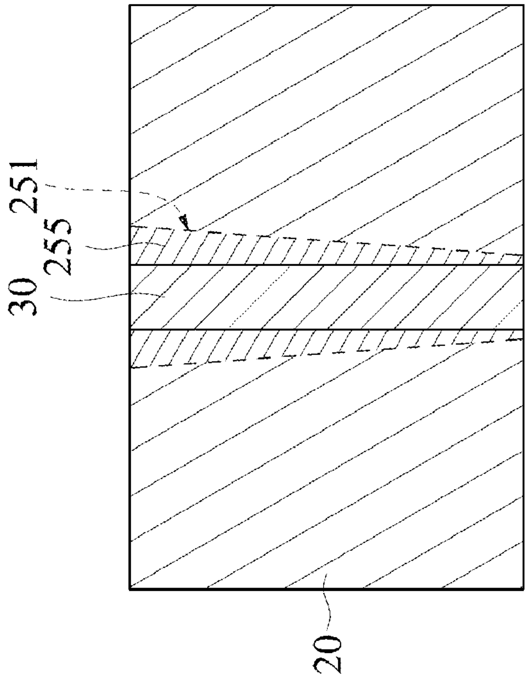
FIG. 5 and FIG. 6 are partial cross-sectional views of a rigid insulating plate according to different implementations.
Figure 5:
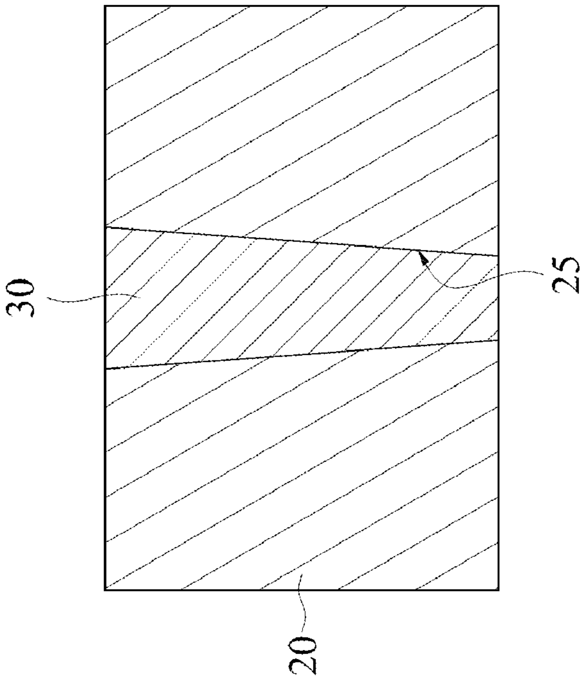

FIG. 5 and FIG. 6 are partial cross-sectional views of a rigid insulating plate 20 according to different implementations. FIG. 5 and FIG. 6 show different precision, drilling and filling patterns. The second through holes 25 may be filled with only the metal posts 30 as shown in FIG. 5. Alternatively, as shown in FIG. 6, a coating 255 is further provided between a side wall surface 251 of the second through holes 25 and the metal post 30. Preferably, the coating 255 may be a resin coating.

Figure 7:
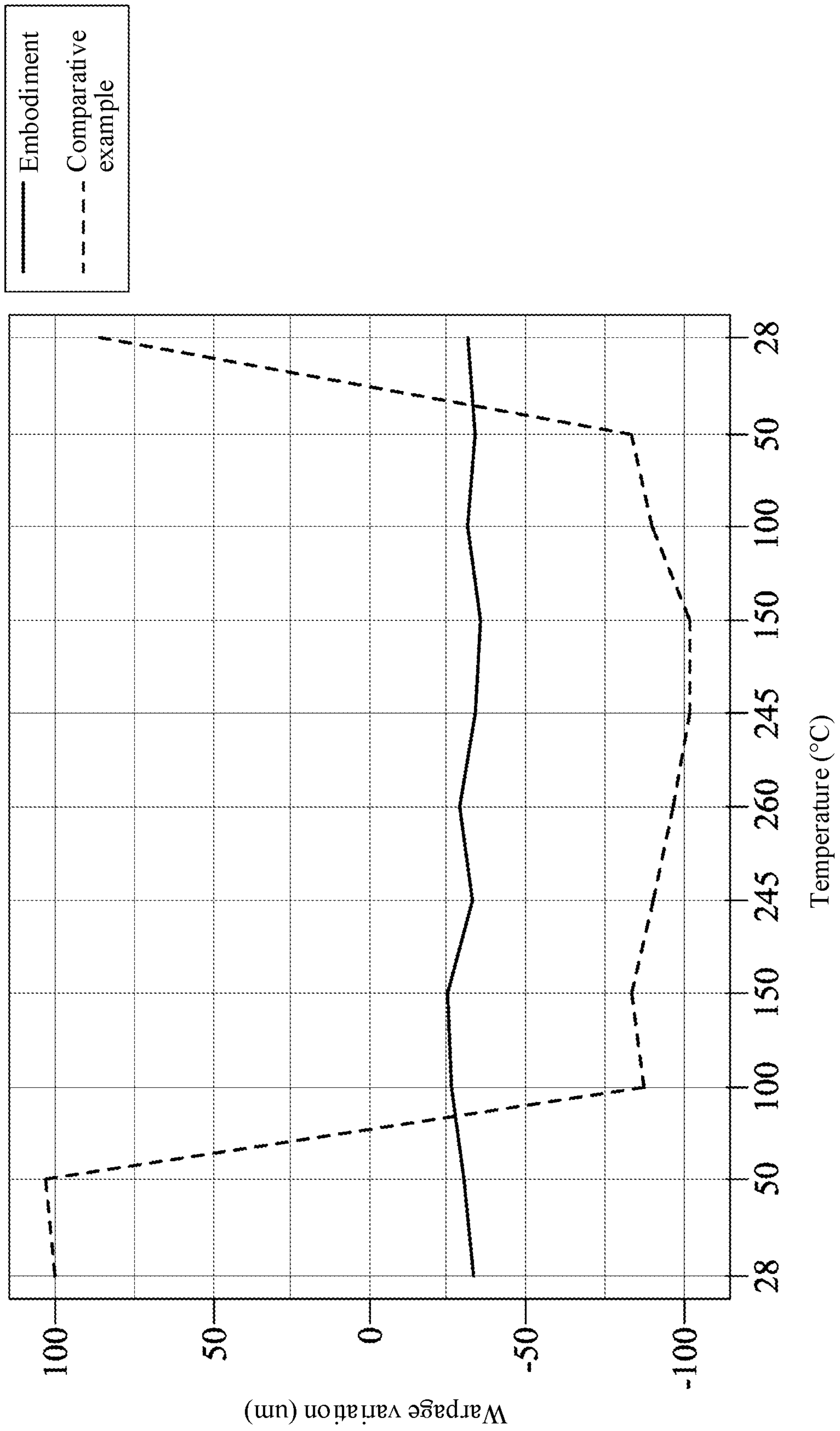
FIG. 7 is a comparison view of an anti-warpage test under heat.

FIG. 7 is a comparison view of an anti-warpage test under heat. In this anti-warpage test under heat, based on the structure of the first embodiment, an embodiment in which the rigid insulating plate 20 is a ceramic plate is adopted, and a comparative example in which the thickness of a core area is increased by 2 cm relative to an all-glass fiber substrate is adopted, so as to compare the warpage of the carrier by simulating the rise and drop of welding temperature. As shown in FIG. 7, obviously, the amount of warping in the comparative example changes obviously from the temperature rise to the temperature drop. The amount of warping in the embodiment is nearly unchanged and almost equal to the error range of test equipment.

In conclusion, by embedding rigid insulating plates 20 therein, the anti-warpage reinforced carrier 1 can effectively provide thermal stability while heated, increase mechanical strength, and provide high coplanarity and stability of small chips and large-area packaging, and is suitable for high-density applications in advanced chip packaging.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An anti-warpage reinforced carrier, comprising:

a substrate having an upper surface and a lower surface, wherein a plurality of positioning areas are defined on the upper surface, and the substrate further has a plurality of first through holes penetrating through the upper surface and the lower surface;

a plurality of rigid insulating plates arranged on the positioning areas respectively, each rigid insulating plate having a plurality of second through holes penetrating through a first surface and a second surface of each rigid insulating plate;

a plurality of metal posts filled in the second through holes respectively;

a resin layer on the upper surface of the substrate and the rigid insulating plates and covering the rigid insulating plates and the upper surface of the substrate, wherein the resin layer has a plurality of openings;

a first circuit layer on a portion of a surface of the resin layer and in the openings, and connected to the metal posts;

a second circuit layer on a portion of the lower surface of the substrate and in the first through holes, and connected to the metal posts;

a first anti-welding paint layer on the resin layer and having a plurality of first pad openings;

a first pad layer filled in the first pad openings and electrically connected to the first circuit layer;

a second anti-welding paint layer on the lower surface of the substrate and having a plurality of second pad openings; and a second pad layer filled in the second pad openings and electrically connected to the second circuit layer.

2. The anti-warpage reinforced carrier according to claim 1, wherein the openings are in positional correspondence with the second through holes respectively.

3. The anti-warpage reinforced carrier according to claim 1, wherein the first surface of each rigid insulating plate further comprises a third circuit layer, the third circuit layer is connected to the metal posts in the second through holes and the first circuit layer.

4. The anti-warpage reinforced carrier according to claim 3, wherein the second surface of each rigid insulating plate further comprises a fourth circuit layer, the fourth circuit layer is connected to the metal posts in the second through holes and the second circuit layer.

5. The anti-warpage reinforced carrier according to claim 1, wherein a coating is further provided between a side wall surface of the second through holes and the metal post.

6. The anti-warpage reinforced carrier according to claim 5, wherein the coating is a resin coating.

7. The anti-warpage reinforced carrier according to claim 1, wherein the upper surface of the substrate has a plurality of grooves, the grooves defines the positioning areas, and the rigid insulating plates are clamped into the grooves respectively.

8. The anti-warpage reinforced carrier according to claim 1, wherein the first pad layer comprises a plurality of first pads protruding from the first anti-welding paint layer, the second pad layer comprises a plurality of second pads protruding from the second anti-welding paint layer, and a first gap between the first pads is smaller than a second gap between the second pads.

9. The anti-warpage reinforced carrier according to claim 1, further comprising a first protective layer, a first redistribution layer, a second protective layer, and a second redistribution layer, wherein the first protective layer is between the resin layer and the first anti-welding paint layer, covers the first circuit layer, and has a plurality of first openings; the first redistribution layer is on a portion of the first protective layer, is filled in the first openings, and is connected to the first circuit layer and the first pad layer; the second protective layer is between the lower surface of the substrate and the second anti-welding paint layer, covers the second circuit layer, and has a plurality of second openings; and the second redistribution layer is on a portion of the second protective layer, is filled in the second openings, and is connected to the second circuit layer and the second pad layer.

10. The anti-warpage reinforced carrier according to claim 9, wherein the first openings are in positional correspondence with the first pad openings respectively, and the second openings are in positional correspondence with the second pad openings respectively.

11. The anti-warpage reinforced carrier according to claim 1, wherein each rigid insulating plate is a ceramic plate, a glass plate, or a silicon carbide plate.

12. The anti-warpage reinforced carrier according to claim 1, wherein each rigid insulating plate has a length and width of 3 cm to 100 cm and a thickness of 0.1 mm to 1 mm.

* * * * *